United States Patent
Uchiyama et al.

(10) Patent No.: US 6,912,760 B2
(45) Date of Patent: Jul. 5, 2005

(54) METHOD OF MANUFACTURING A THIN FILM PIEZOELECTRIC ELEMENT

(75) Inventors: Hirokazu Uchiyama, Higashiosaka (JP); Hideki Kuwajima, Kyoto (JP)

(73) Assignee: Matsushita Electric Industrial Co., Ltd. (JP)

( * ) Notice: Subject to any disclaimer, the term of this patent is extended or adjusted under 35 U.S.C. 154(b) by 89 days.

(21) Appl. No.: 10/253,889

(22) Filed: Sep. 25, 2002

(65) Prior Publication Data

US 2003/0057804 A1 Mar. 27, 2003

(30) Foreign Application Priority Data

Sep. 27, 2001 (JP) ........................................ 2001-296829

(51) Int. Cl.[7] .......................... H04R 17/10; B32B 31/00
(52) U.S. Cl. .......................... 29/25.35; 29/830; 29/831; 310/311; 156/239; 156/247
(58) Field of Search ................................ 29/25.35, 846, 29/831, 830; 310/311, 321, 365; 156/239, 241, 233, 247

(56) References Cited

U.S. PATENT DOCUMENTS 5,013,397 A * 5/1991 Tsukakoshi ............. 156/233 X

FOREIGN PATENT DOCUMENTS

| JP | 60-242800 | * 12/1985 | ................ 29/25.35 |
|---|---|---|---|
| JP | 01-308927 | 12/1989 | |
| JP | 08-070143 | 3/1996 | |
| JP | 09-181368 | 7/1997 | |
| JP | 10-142530 | 5/1998 | |
| JP | 11-142753 | 5/1999 | |
| JP | 11-345833 | 12/1999 | |

OTHER PUBLICATIONS

Mills et al., "Combining Multi–Layers and Composites to Increase SNR for Medical Ultrasound Transducers", Ultrasonics Symposium, 1996, IEEE Proceedings, pp. 1509–1512, Nov. 1996.*

* cited by examiner

Primary Examiner—A. Dexter Tugbang
(74) Attorney, Agent, or Firm—Parkhurst & Wendel, L.L.P.

(57) ABSTRACT

A thin film piezoelectric element used in an actuator unit for fine positioning, and its manufacturing method, the manufacturing method including laminating two piezoelectric thin films held between electrode layers by using adhesive, and selectively removing only the second substrate in order to process the thin films remaining on the first substrate into a plurality of separated structures. After that, an insulating layer and external connecting electrode are formed to cover the exposed surface of the structure, thereby forming a plurality of thin film piezoelectric elements. Resin is applied to cover the thin film piezoelectric element, and a temporary fixing substrate is bonded thereto, and after selectively removing the first substrate, the temporary fixing substrate is separated, and the resin is removed from the piezoelectric element surface in order to separate the plurality of thin film piezoelectric elements.

14 Claims, 11 Drawing Sheets

METHOD OF MANUFACTURING A THIN FILM PIEZOELECTRIC ELEMENT

FIELD OF THE INVENTION

The present invention relates to a thin film piezoelectric element used as an actuator or a sensor for delicate positioning, and its manufacturing method, and an actuator unit using same.

BACKGROUND OF THE INVENTION

With the recent progress of semiconductor technology, efforts are made in order to realize the remarkable miniaturization of mechanical structures by using semiconductor technology, and electro-mechanical conversion elements such as micro-actuators or the like are now spotlighted. Such elements are capable of realizing the manufacture of small-sized highly accurate mechanism components, and greatly improving the productivity with use of a semiconductor process. Particularly, micro-actuators using piezoelectric elements are applied to the micro-displacement elements of a scanning tunnel microscope, and actuators for delicate positioning such as the head slider of a magnetic disk drive unit.

For example, in a magnetic disk drive unit, efforts are made as described below. Usually, a magnetic head for recording and reproducing of information on a magnetic disk is mounted on a head slider and fitted to an actuator arm. The actuator arm is rocked by means of a voice coil motor (hereinafter called VCM) and positioned to a specified track position on the magnetic disk, thereby recording and reproducing the information with the magnetic head. However, as the recording density is increased, it is now difficult to assure sufficient accuracy by using only such a conventional VCM for positioning. Accordingly, in addition to the positioning means of VCM, a technology of high-speed and highly accurate positioning that can be realized by fine driving of a head slider with use of a fine positioning means using piezoelectric elements is proposed. [For example, extra-high TPI and piggy-back actuators (IDEMA Japan News No. 32, pp 4–7, by International Disk Drive Association)].

As described above, various applications of actuators using piezoelectric elements are expected, but multilayer configurations such as a green sheet laminate system or a thick film multilayer system have been conventionally employed in particular (for example, Japanese Laid-open Patent H6-224483). However, one layer of a piezoelectric element manufactured by such method is about several 10 $\mu$m in thickness, and therefore, it requires a driving voltage of about 100V.

As a method for solving this problem, Japanese Laid-open Patent No. H8-88419 discloses a thin film laminate type actuator that is small-sized, is driven with a low voltage, and has a large amount of displacement. Its manufacturing method is also described. That is, an electrode layer of platinum or the like, a piezoelectric layer made up of piezoelectric material such as lead zirconate titanate (PZT), an electrode layer, and a bonding layer made up of glass or silicon are in that order evaporated on a mono-crystalline substrate of magnesium oxide or the like, thereby forming a piezoelectric member. Piezoelectric members thus formed are bonded to each other by an anode bonding method, and the substrate at the side of further lamination is removed by grinding or the like, and a bonding layer is formed on the electrode layer then exposed. After that, a step of bonding the bonding layer to the bonding layer of another piezoelectric member according to the procedure as described above is repeated to form a laminate body. After that, inner layer electrodes are alternately taken out from both sides in order to obtain a laminate type actuator. Also, as a method of bonding piezoelectric members to each other, it is disclosed that a surface activation bonding method and an adhesive application bonding method may also be employed in addition to the anode bonding method. However, in this manufacturing method, since an external electrodes is formed from two sides of a laminate body, with a piezoelectric member laminatee thereon, via an insulating layer, it is necessary to form the external electrode at least for each individual laminate body, and there arises a problem of productivity. Also, the configuration is such that displacement takes place in a direction vertical to the substrate surface, and for example, there arises a problem such that the shape is not suited for internal use as a miniature actuator for the head slider of a magnetic disk drive unit.

Further, Japanese Laid-open Patent No. H11-345833 discloses a manufacturing method for mounting a pyroelectric element and piezoelectric element on a separately disposed electrode forming substrate with good productivity. In this method, an element formed on a temporary substrate with an element transfer jig is fixed at a predetermined position by using resin or double-side adhesive tape or the like, followed by selective etching of only the temporary substrate. Subsequently, an electrode provided on the electrode forming substrate is bonded, by soldering for example, to the electrode of the element which is opposed thereto. After that, the resin or adhesive tape or the like used for fixing the element is removed to separate the element transfer substrate and the element from each other, and thereby, a pyroelectric element and piezoelectric element are formed in a state of being bonded to an electrode forming substrate as specified. Since the element is fixed on the element transfer jig, there is no fear of causing the elements to be deformed or damaged even when the temporary substrate is selectively etched and removed, and it is possible to maintain the specified position and to bond them together onto the electrode forming substrate. However, in this manufacturing method, individually separated elements are bonded, but such a system makes it relatively difficult to execute their individual bonding while accurately positioning the elements on the element transfer substrate, and with decrease in size and increase in the number of electrode terminals, there arises a problem of positional deflection in relation to the electrode forming substrate. Also, the adhesive is required to be a material that may endure the soldering temperature for mounting and also to be a stable adhesive material that can be removed by a specified solution even after being subjected to the temperature.

Accordingly, in a piezoelectric element which is formed on a substrate by laminating a plurality of piezoelectric thin films, held between electrode layers, with use of adhesive, the problems to be solved are to provide a manufacturing method that ensures a high yield and good productivity without characteristics deterioration of each component material, particularly, to manufacture piezoelectric elements with electrodes arranged on same surface in order to realize a piezoelectric actuator in the paired form of two elements and, at the same time, to improve the productivity and provide the products at low costs.

SUMMARY OF THE INVENTION

The present invention includes a thin film piezoelectric element and its manufacturing method, and the manufacturing method comprises the steps of:

(1) forming electrode layers and piezoelectric thin films respectively on a first substrate and a second substrate;
(2) bonding piezoelectric thin film formed surfaces in opposed relation to each other;
(3) selectively removing only the second substrate;
(4) forming a plurality of structures by processing and separating the thin films remaining on the first substrate individually or together in a desired shape;
(5) forming an insulating layer so as to cover each exposed surface of the plurality of structures, and also, forming an external connecting electrode for connecting these electrode layers to external equipment, thereby obtaining a plurality of piezoelectric elements;
(6) applying resin so as to cover a plurality of piezoelectric elements and bonding a temporary fixing substrate; and
(7) selectively removing only the first substrate to separate the temporary fixing substrate from the piezoelectric elements, and also, removing the resin from the piezoelectric element surfaces to individually separate the plurality of piezoelectric elements.

By this configuration, it is possible to precisely protect the thin film piezoelectric elements by the temporary fixing substrate and the resin, preventing the piezoelectric thin film, insulating layer, or the conductive layer of the external connecting electrode from being corroded by the etching solution of the first substrate, and to manufacture piezoelectric elements without deterioration of each material. Accordingly, the freedom of selection of these materials will be increased, and it becomes possible to employ electrode materials having excellent mounting characteristics and insulating layer materials capable of improve reliability.

Due to this manufacturing method, bonding a pair of piezoelectric thin films held between electrode layers in particular, a number of thin film piezoelectric elements having a connecting electrode only on one plane side can be manufactured on a sheet of substrate. Also, it is easy to manufacture an actuator element consisting of a pair of piezoelectric elements, integrating two piezoelectric elements of such paired structure into a set. Such piezoelectric elements will give rise to the increase of strength and also may enable shortening of the working man-hour in the manufacturing processes and the mounting process such as wire bonding process.

BRIEF DESCRIPTION OF THE INVENTION

FIG. 9A.

DETAILED DESCRIPTION OF THE INVENTION

Figure 1:
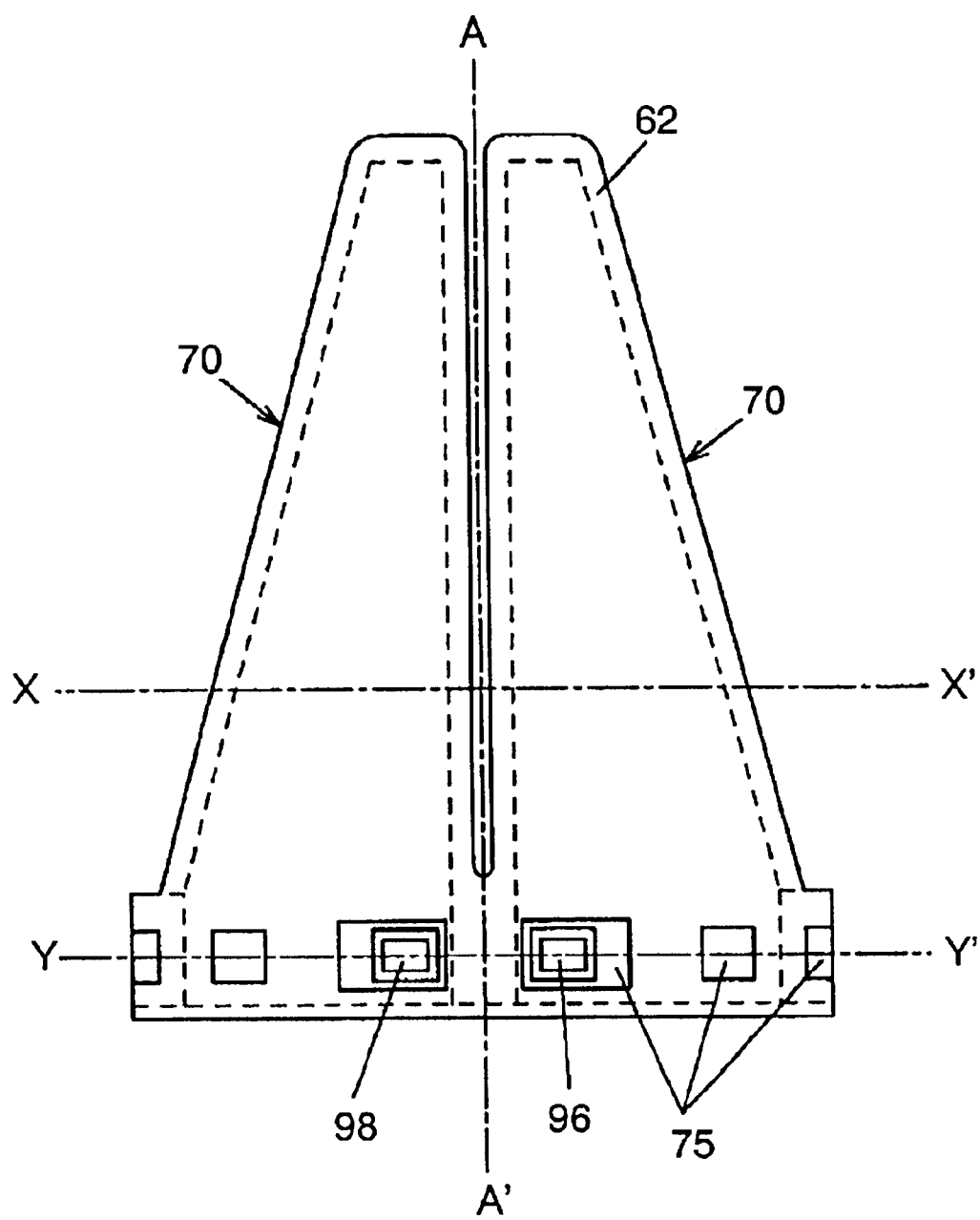
FIG. 1 is a plan view of an actuator element manufactured by a manufacturing method in the first preferred embodiment of the present invention.

The preferred embodiments of the present invention will be described in the following with reference to the drawings.
First Exemplary Embodiment FIG. 1 is a plan view of an actuator with paired two piezoelectric elements made by the manufacturing method in the first preferred embodiment. The actuator element is used in a magnetic disk drive unit, for the purpose of accurately and delicately positioning a head slider to a specified track position on the disk. The actuator element shown comprises paired two piezoelectric elements 70, and the paired elements 70 are formed in mirror image fashion to each other against the A-A' line. The sectional structures along the X-X' line and Y-Y' line in FIG. 1 are respectively shown in FIG. 2A and FIG. 2B. The configuration is described in the following with reference to these figures.

Figure 2A:
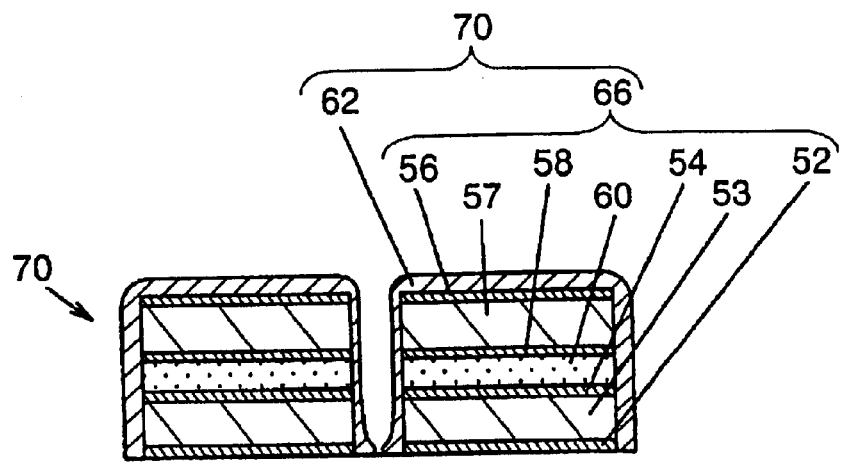
FIG. 2A is a sectional view of the X'-X' portion of the actuator shown in FIG. 1.
Figure 2B:
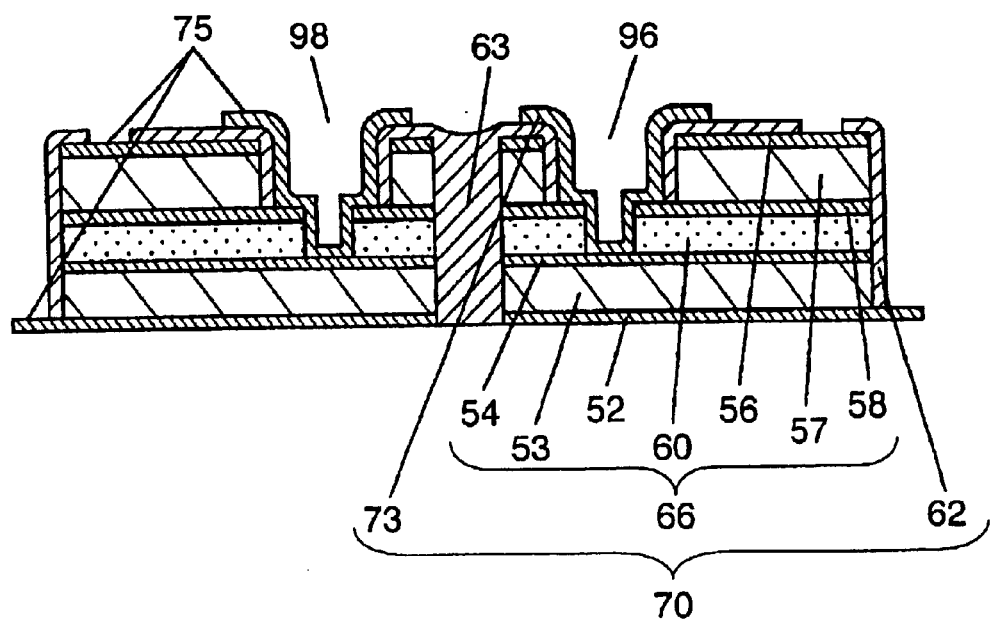
FIG. 2B is a sectional view of the X'-X' portion of the actuator shown in FIG. 1.

As shown in FIG. 2A and FIG. 2B, the paired piezoelectric elements 70 are same in structure, and in each of these, first piezoelectric thin film 53 held between first lower electrode layer 52 and first upper electrode layer 54 is bonded to second piezoelectric thin film 57 held between second lower electrode layer 56 and second upper electrode layer 58 by bonding layer 60, thereby forming structure 66, and insulating layer 62 is formed so as to cover the structure 66. At the same time, the insulating layer 62 is formed in such manner as to fill an area 63 between via-holes 96, 98 provided in each of the paired piezoelectric elements 70, and thereby, the paired piezoelectric elements 70 are integrated. Due to this configuration, handling and positioning in mounting the elements on a substrate will be simplified.

Also, for the connection of these electrode layers to external equipment, as shown in FIG. 2B, electrode layer 73 for connection to the via-holes 96, 98 is formed by photolithography and etching in order to make external connecting electrode 75 for connection to specified external equipment. As to the first lower electrode layer 52, the portion exposed by etching the range from the second lower electrode layer 56 to the first piezoelectric thin film 53, as to the second lower electrode layer 56, the portion exposed by etching the insulating layer 62, and as to the first upper electrode layer 54 and the second upper electrode layer 58, the portion led out to the surface from the via-holes 96, 98 by using the connecting electrode 73, are respectively the external connecting electrode 75.

Figure 3:
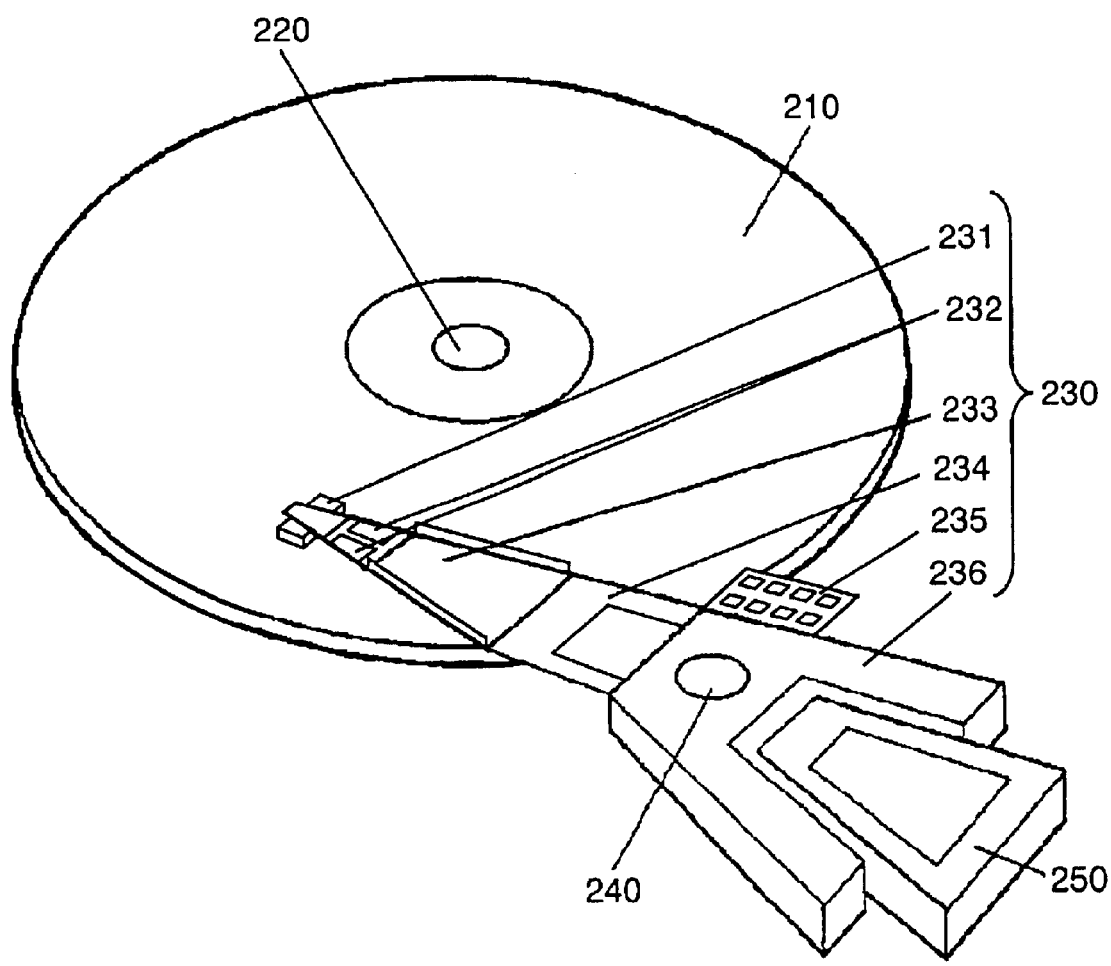
FIG. 3 is a perspective view showing a disk unit using an actuator formed by the manufacturing method in the first preferred embodiment.

One embodiment of a disk drive unit using an actuator element having such a configuration is shown in FIG. 3. Actuator unit 230 comprises slider 231 with a head (not shown) for recording and reproducing on a disk, suspension 233, actuator element 232 having a pair of thin film piezoelectric elements, plate spring 234, supporting arm 236, and flexible wiring board 235.

The slider 231 is supported by the suspension 233, and a head (not shown) is mounted on a surface opposing to disk 210. The actuator element 232 having the paired thin film piezoelectric elements 70 is fixed, close to the slider 231, on the suspension 233.

The suspension 233 is fixed on the plate spring 234, and the plate spring 234 is fixed on the supporting arm 236. The suspension 233, plate spring 234 and supporting arm 236 make up a support member.

The supporting arm 236 is journaled on bearing 240 and is free to rotate. Also, the supporting arm 236 is provided with the flexible wiring board 235 for electrically connecting the head and actuator element 232 to external circuits. Further, the supporting arm 236 is provided with voice coil 250 making up a voice coil motor for rotating the supporting arm 236. The voice coil 250 and a magnet (not shown) secured on a casing (not shown) make up a voice coil motor. Accordingly, the actuator unit 230 is capable of positioning in two steps, that is, positioning by the voice coil motor and positioning by the actuator element 232.

The operation of a disk drive unit using the actuator unit 230 will be described in the following. When the disk 210 is rotated by spindle motor 220, air flows in between the slider 231 and the disk 210, forming an air lubricating film. When the pressure of the air lubricating film is balanced with the pressing force of the plate spring 234, the slider flys and becomes stabilized. The flying height ranges from about 10 nm to 50 nm. Since the head is positioned to the specified track position of disk 210 while the slider is in a state of such flying, the supporting arm 236 is rotated by the voice coil motor. In an ordinary disk drive unit, positioning to a specified position can be done only by the voice coil motor. However, in the case of higher density recording, the track density will also be increased, and it is required to execute such positioning with higher accuracy. The actuator element 232 having thin film piezoelectric elements 70 is intended to meet the requirement. The actuator element 232 is disposed near the slider 231 of the suspension 233, and by driving the actuator element 232, the head position can be freely moved by about several $\mu$m irrespective of the suspension 233 and the supporting arm 236. That is, since the actuator element 232 includes a pair of thin film piezoelectric elements 70 being same in structure, the head position can be moved by about several $\mu$m by applying a voltage in such direction that one element expands while the other shrinks. Since the actuator element 232 is disposed near the slider 231, it is possible to drive only the slider 231 irrespective of the suspension 233 and the supporting arm 236.

Due to the above operation, highly accurate positioning can be performed in two steps by means of voice coil motor and actuator elements 70. The actuator unit 230 is only an example, and it is preferable to use various configurations for a support member in particular.

A manufacturing method for the piezoelectric element 70 will be described in the following with reference to FIG. 4A to FIG. 7. In the process drawings of FIG. 4A to FIG. 6C is shown the sectional portion along the X-X' line in FIG. 1.

Figure 4A:
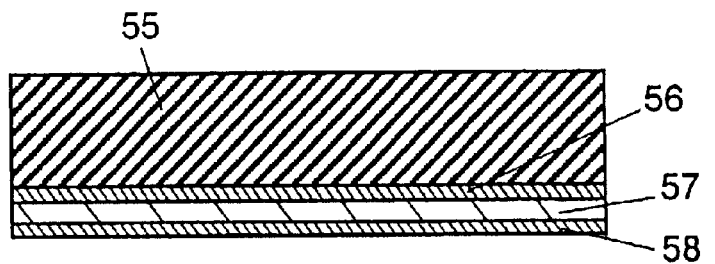
FIG. 4A is a side view showing the positions of the first laminate body and the second laminate body in a main step of the manufacturing method in the first preferred embodiment of the present invention.
Figure 4A:
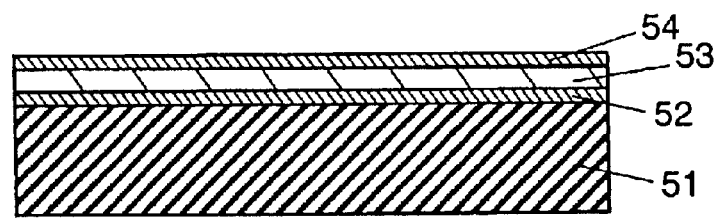

FIG. 4A shows a state such that a laminate body with the first lower electrode layer 52, the first piezoelectric thin film 53, and the first upper electrode layer 54 sequentially formed on the first substrate 51, and a laminate body with the second lower electrode layer 56, the second piezoelectric thin film 57, and the second upper electrode layer 58 similarly sequentially formed on the second substrate 55 are arranged so that the first upper electrode layer 54 is opposed to the second upper electrode layer 58. For example, by using a surface (100) of a magnesium oxide mono-crystalline substrate (MgO substrate) as the first substrate 51 and the second substrate 55, and forming a film by sputtering platinum (Pt) target as the first lower electrode layer 52 and the second lower electrode layer 56, it is easy to obtain a Pt electrode layer oriented to the surface (100). Further, by forming a film by sputtering lead zirconate titanate (PZT) target on the first lower electrode layer 52 and the second lower electrode layer 56 made up of the Pt layer, a piezoelectric thin film having good piezoelectric characteristics which is oriented in a vertical direction to a perovskite type film can be obtained. Since the first piezoelectric thin film 53 and the second piezoelectric thin film 57 of about 3 $\mu$m in thickness may be used, it is possible to set the driving voltage to 10V or less.

Accordingly, since the first lower electrode layer and the second lower electrode layer are formed by using same material and same film deposition apparatus, it is possible to indiscriminately execute the electrode layer depositing operation with respect to the first substrate and the second substrate, and as a result, the expensive film deposition apparatus can be efficiently used, enabling the further improvement of the productivity. Also, since the first upper electrode layer and the second upper electrode layer, the first piezoelectric thin film and the second piezoelectric thin film are formed by using same material and same film deposition apparatus, it is possible to efficiently execute the piezoelectric thin film deposition operation that usually takes much time and labor. Furthermore, by forming the first piezoelectric thin film and the second piezoelectric thin film simultaneously on same apparatus, it is possible to make the piezoelectric thin film nearly uniform in characteristics in a state of laminate. Particularly, with the first substrate and the second substrate being identical with each other, and with the first lower electrode layer and the second lower electrode layer being identical with each other, simultaneous forming of piezoelectric thin film on these substrates enables making them identical in electric field strength even when a voltage is equally applied to each piezoelectric thin film of the piezoelectric element, making it possible to obtain uniform characteristics and to improve the reliability. Also, by using the first substrate and the second substrate being same in material and shape, it is possible to make the piezoelectric thin film formed on these substrates nearly same in characteristics. Further, since the first piezoelectric thin film and the second piezoelectric thin film can be formed under same conditions, it is possible to execute simultaneous film forming and to improve the productivity.

Also, as a material for the first upper electrode layer 54 and the second upper electrode layer 58, there is no particular limitation provided that the material has selectivity such that the electrode layer is not etched when etching the piezoelectric thin film. Similarly, it is preferable to use Pt layer, and also to use metals such as nichrome, gold, copper, tantalum, and nickel, or conductive materials such as oxide or nitride.

Figure 4B:
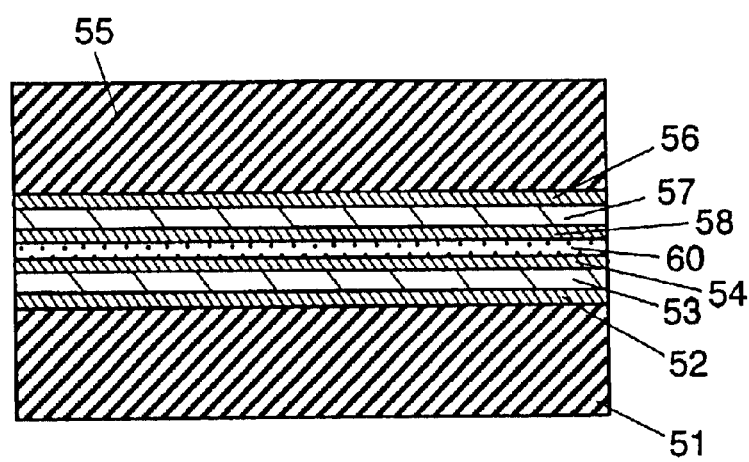
FIG. 4B is a sectional view of the first and second laminate bodies bonded via a bonding layer.

Two substrates thus formed are bonded to each other by adhesive, as shown in FIG. 4B, with the first upper electrode layer 54 and the second upper electrode layer 58 opposed to each other. The adhesive is desirable to be inorganic or organic adhesive generally used for bonding metals or ceramics, of which adhesive layer 60 after bonding has no viscoelasticity. Further, it is possible to use photo resist materials provided that the material after bonding has no viscoelasticity, and above all, photo resist improved in heat resistance can be used as effective adhesive. Also, the thickness of adhesive layer 60 is desirable to be nearly same as that of the second piezoelectric thin film 57 at least. The adhesive layer 60 is enhanced in strength as a structure, while processability may be assured in making via-holes for forming external connecting electrodes from the second piezoelectric thin film 57. That is, in case the adhesive layer 60 is thicker than the second piezoelectric thin film 57, the strength as a piezoelectric element will be improved, but it will become more difficult to make via-holes for connecting the first upper electrode layer 54 and the second upper electrode layer 58 to the external connecting electrodes. Contrarily, if the adhesive layer 60 is thinner than the second piezoelectric thin film 57, it will be easier to make via-holes, but the strength as a piezoelectric element is decreased. In order to solve these problems, the thickness of the adhesive layer 60 is desirable to be nearly equal to that of the second piezoelectric thin film 57.

Figure 4C:
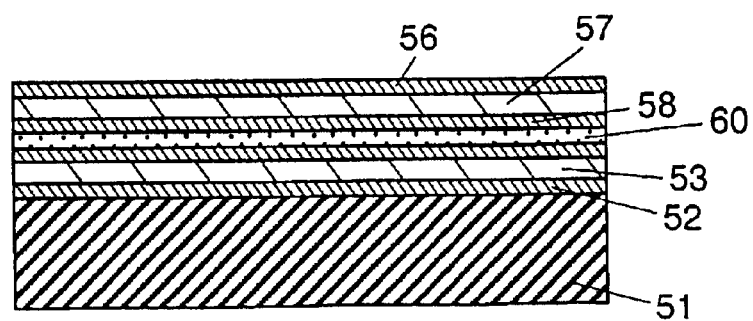
FIG. 4C is a sectional view showing a structure with the second substrate removed.

Next, as shown in FIG. 4C, only the second substrate 55 is selectively removed. As the removing method, it is possible to employ a wet etching or dry etching method. The first substrate 51 and the second substrate 55 being same in material, when the second substrate 55 is removed by wet etching, it is desirable to previously cover the substrate with a material such as photo resist that has resistance to etching so that the first substrate 51 will not come into contact with the etching solution. In case a mono-crystalline substrate of magnesium oxide is used as such substrate, the second substrate 55 can be removed by using heated phosphoric solution. Also, when a silicon mono-crystalline substrate is used, it can be removed by using the mixed solution of hydrofluoric acid and nitric acid.

When a dry etching method is employed, the first substrate 51 is placed in tight contact with the etching table, and therefore, only the side surface of the first substrate 51 is exposed to the etching gas. Accordingly, in this case, it is not necessary to cover the entire surface of the first substrate 51 with a material that is resistant to etching in particular. Also, when the second substrate 55 is removed, it is also possible to polish the second substrate 55 to make it thinner before removing the substrate by wet etching or dry etching.

Figure 5A:
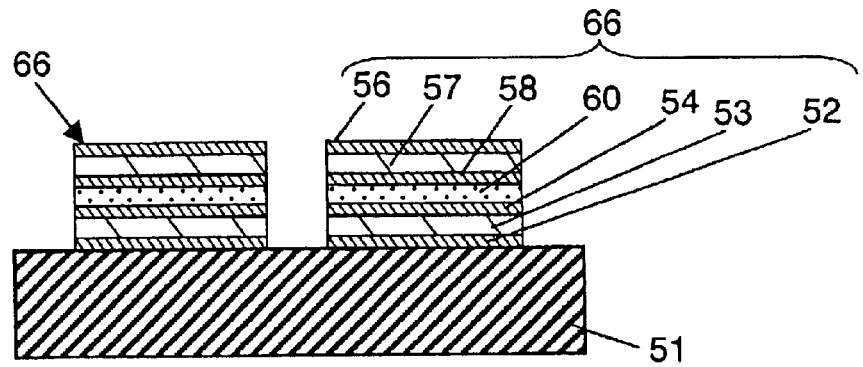
FIG. 5A is a sectional view showing a plurality of structures on the first substrate formed by selective etching in a main step of the manufacturing method in the first preferred embodiment of the present invention.

With the second substrate 55 removed, all the layers including the second lower electrode layer 56, the second piezoelectric thin film 57, and the second upper electrode layer 58 formed on the second substrate 55 are in a state of being accumulated on the first substrate 51. In this state, by selectively removing the portion by photolithography and etching except the area surrounded by the broken line in FIG. 1, it is possible to obtain a plurality of structures 66 separated on the first substrate 51 as shown in FIG. 5A.

For example, when separating all the laminated layers by etching, the second lower electrode layer 56, the second piezoelectric thin film 57, the second upper electrode layer 58, adhesive layer 60, the first upper electrode layer 54, the first piezoelectric thin film 53, and the first lower electrode layer 52 can be removed by dry etching respectively with use of different reaction gases or same reaction gas, after forming photo resist in a specified pattern. It is also possible to employ a wet etching method or to perform a combination of both wet etching and dry etching as needed. The process can be simplified by forming via-holes 96, 98 at the same time when forming the structure 66.

Figure 5B:
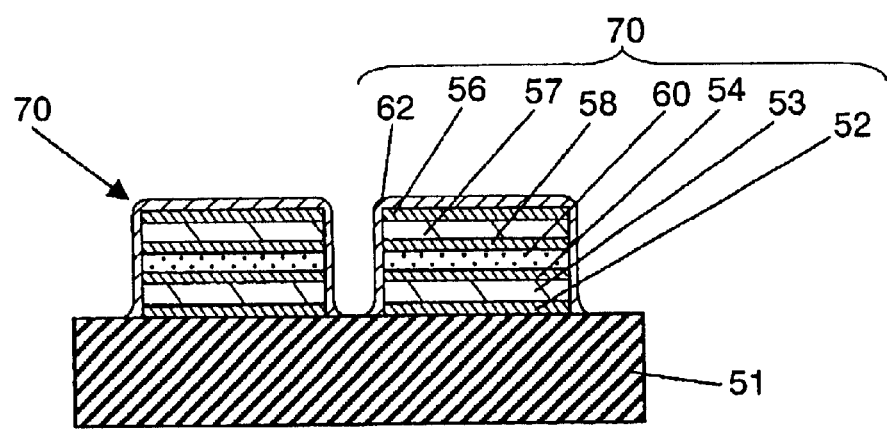
FIG. 5B is a sectional view showing a plurality of structures coated with insulating layer.

Further, as shown in FIG. 5B, the plurality of structures 66 are coated with insulating layer 62. The insulating layer may be formed by applying liquid resin and hardening it by heat treatment. For example, it is preferable to apply liquid polyamide by using a spinner, and after drying, to heat it at about 350° C. to obtain a polyimide layer, or to apply other organic resin, followed by heating and hardening, or to form a layer based on silicon oxide according to a sol-gel method. Moreover, it is possible to use a silicon oxide layer, silicon nitride layer, or the mixture of these which are formed by sputtering or CVD method.

Further, after photolithography and etching of insulating layer 62 in the area of via-holes 96, 98, the connecting electrode 73 is formed as shown in FIG. 2B as described above. As a result, the external connecting electrodes 75 are formed for the connection of each electrode layer to external equipment. As a method for achieving this purpose, to expose only the first lower electrode layer 52 for example, after etching up to the first piezoelectric thin film 53, perform photolithography again to form a specified resist pattern before etching to remove the unessential portion of the first lower electrode layer 52, then only the specified pattern of the first lower electrode layer 52 can be exposed. In this case, to make the first piezoelectric thin film 53 harder to be exposed to the chemical solution for removing the first substrate 51, it is one of the effective means to make the first lower electrode layer 52 a little wider than the first piezoelectric thin film 53. The purpose may be achieved by disposing only the area of the external connecting electrode 75 with respect to the first lower electrode layer 52 and also simultaneously forming it wider than the outer shape of the first piezoelectric thin film 53, and such a pattern can be simply made without increasing the number of steps.

Also, the portion of via-holes 96, 98 can be formed by selectively etching the second lower electrode layer 56 and the second piezoelectric thin film 57 at the specified position shown in FIG. 2B, thereby exposing the second upper electrode layer 58. Subsequently, the purpose can be achieved by making a resist pattern shape by lithography, which is smaller than the selectively etched area, followed by etching the second upper electrode layer 58 and the adhesive layer 60. After that, form the insulating layer 62 and etch it in the specified pattern, followed by forming the connecting electrode 73 to make the specified pattern shape, then the first upper electrode layer 54 and the second upper electrode layer 58 connected in common are led out to the surface, and thereby, a structure having the external connecting electrode 75 on the surface can be obtained.

According to this manufacturing method, the external connecting electrodes can be formed together on the first substrate, and also, mounting by wire bonding for example, for the connection to external equipment, can be efficiently performed. Further, since the external connecting electrodes are concentrated on one surface, it is easy to bond the piezoelectric elements to the substrate.

Also, as the adhesive layer 60, conductive material can also be used, and in that case, it is not necessary to perform the above second pattern forming and etching, and the process can be simplified. Further, even when it is necessary to separately take out the first upper electrode layer 54 and the second upper electrode layer 58, it can be easily performed in a similar step.

Figure 5C:
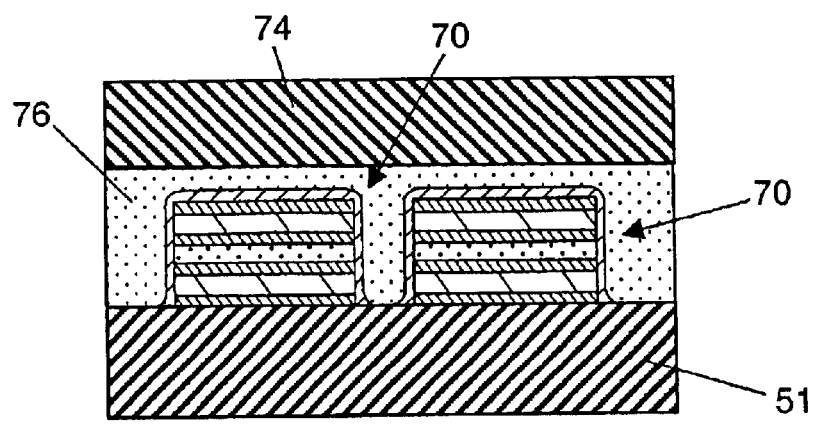
FIG. 5C is a sectional view showing a plurality of structures coated with temporary fixing substrate and insulating layer, which are bonded by resin layer.

A pair of piezoelectric elements 70 thus formed on the first substrate 51 are covered with resin layer 76, and at the same time, temporary fixing substrate 74 is bonded by the resin layer 76. By this method, bonding of the temporary fixing substrate and forming of the resin layer to protect the piezoelectric element from the etching solution can be done at one time, and thereby, the process can be simplified. It is illustrated in FIG. 5C. The resin layer 76 is required to have adhesion of such a level that the temporary fixing substrate 74 will not peel off in the step of removing the first substrate 51 and to be a material capable of resisting the chemical solution used for removing the first substrate 51 by etching or the reaction gas used for dry etching. For example, tar-based wax, acrylic adhesive, thermosetting resin, or photo resist can be employed. Also, it is preferable to initially cover the piezoelectric element 70 with photo resist for example and dry it to form the resin layer 76, followed by bonding the temporary fixing substrate 74 with acrylic adhesive or the like. By using such configuration, it is possible to make the solution for dissolving the adhesive different from the solution for dissolving the photo resist, resin layer 76. As a result, since the piezoelectric element 70 is not exposed to the solution for dissolving the adhesive, it is possible to prevent the piezoelectric element 70 from changing in quality due to the solution.

That is, because the piezoelectric element 70 is precisely protected by the temporary fixing substrate 74 and resin 76 during etching performed for selectively removing the first substrate 51, the piezoelectric thin films 53, 57 of piezoelectric elements 70, insulating layer 62, or the conductor layer 73 of external connecting electrode 75 can be prevented from being corroded by the etching solution. Also, the freedom of selection of these materials will be increased, and it becomes possible to use electrode materials having excellent mounting characteristics and insulating layer materials capable of improving the reliability.

Further, as the temporary fixing substrate 74, various materials such as glass, metal or ferrite, alutic (mix ceramics of alumina and titanium carbide), ceramic material such as alumina can also be used as they are. However, it is required to select a material that is not corroded by the chemical solution and gas for removing the first substrate 51, the gas containing active species in dry etching, or the gas partly ionized at least in dry etching. On the other hand, by forming a layer that is not corroded by such solution or reaction gas over the entire surface of these substrate materials, it is possible to increase the freedom of selection of the temporary fixing substrate 74 and also to enable its repeated using.

For example, when glass is used as the temporary fixing substrate 74, and silicon mono-crystalline substrate (Si substrate) as the first substrate 51, it is preferable to form a chrome layer over the entire surface of the glass. Also, when a stainless sheet, iron plate, copper plate or the like is used as the temporary fixing substrate 74, and MgO substrate as the first substrate 51, it is preferable to form a chrome layer, silicon oxide layer or the like over the entire surfaces of these metal plates.

Figure 6A:
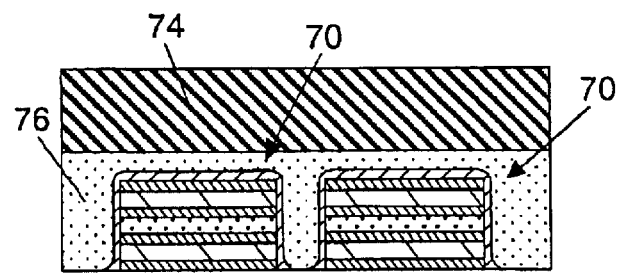
FIG. 6A is a sectional view showing a plurality of structures with only the first substrate etched and removed by chemical solution in a main step of the manufacturing method in the first preferred embodiment of the present invention.

FIG. 6A shows a state of the piezoelectric element 70 with the first substrate 51 removed by etching with a chemical solution after bonding the temporary fixing substrate 74. Due to this process, the paired piezoelectric elements 70 are separated from both the first substrate 51 and the second substrate 55 used for film forming purpose but fixed to the temporary fixing substrate 74 by the resin layer 76, which are therefore free from deforming and wrinkling, and also, maintained in the relative positions as specified.

Figure 6B:
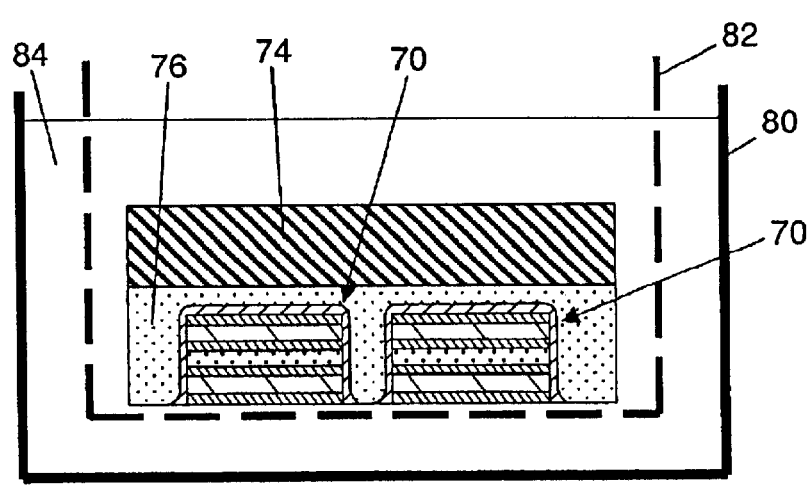
FIG. 6B is an arrangement view showing the arrangement of a structure formed on a temporary substrate which is stored in a mesh vessel containing a solution.
Figure 7:
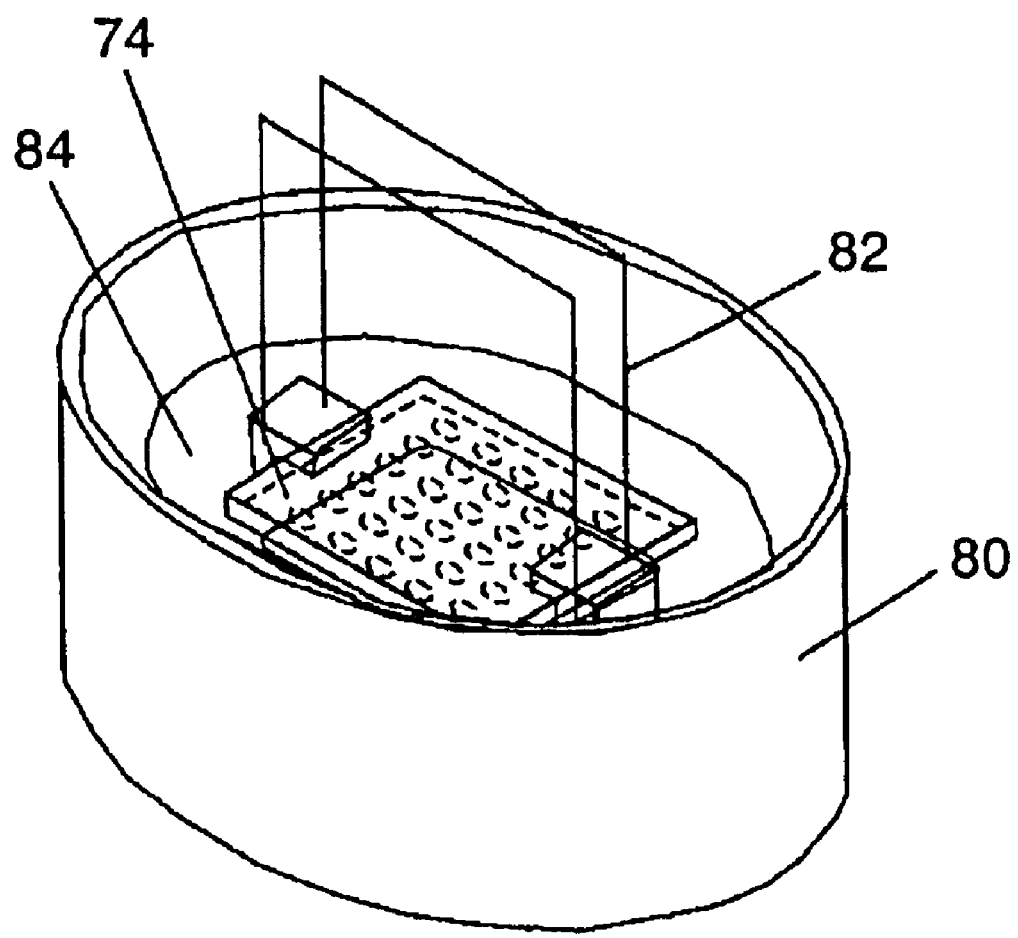
FIG. 7 is a perspective view for describing the step of separating the temporary fixing substrate in the manufacturing method in the first preferred embodiment of the present invention.

Next, as shown in FIG. 6B and FIG. 7, the piezoelectric element 70 held on the temporary fixing substrate 74 is put into mesh vessel 82 and immersed into vessel 80 containing solution 84 for dissolving the resin layer 76, and thereby, the temporary fixing substrate 74 is separated by dissolving the resin layer 76. For example, when tar-based wax is used as the resin layer 76, it is preferable to use xylene as the solution 84. When acrylic adhesive is used, it is preferable to use the exclusive solution provided for each purpose. In FIG. 6B, the piezoelectric element 70 is held in contact with the mesh vessel 82, but it is also preferable to hold the paired piezoelectric elements 70 in a state of rising a little from the bottom of the mesh vessel 82, holding the temporary fixing substrate 74 against either side of the mesh vessel 82. In this way, the piezoelectric elements 70 may be prevented from coming into contact with the bottom of the mesh vessel 82 and being damaged.

Making the mesh of the mesh vessel 82 smaller in size than the piezoelectric element 70 at least, it is possible to prevent the piezoelectric element 70, even when separated from the temporary fixing substrate 74, from falling through the mesh hole onto the bottom of the vessel 80 and being broken into pieces. Also, when taking the mesh vessel 82 out of the vessel 80, the chemical solution may easily go out through the mesh holes, it is possible to precisely remove the resin layer 76 sticking to the piezoelectric elements 70. Further, it is also very easy to put the piezoelectric elements 70 into another vessel for steam cleaning and drying purposes.

Figure 6C:
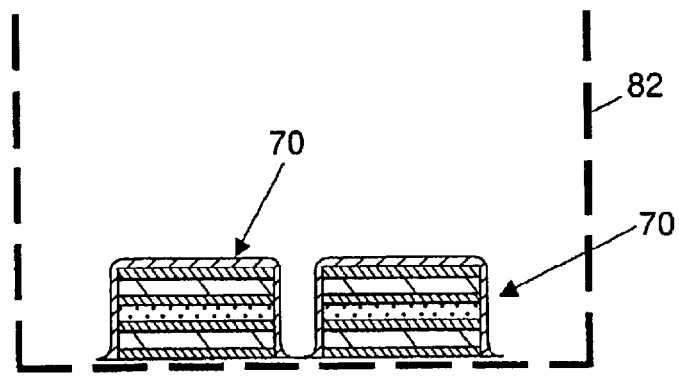
FIG. 6C is an arrangement view showing the arrangement of a structure in a mesh vessel with resin dissolved and removed.

FIG. 6C shows a state of the piezoelectric elements 70 in the mesh vessel 82 taken out of the vessel 80 after finishing such dissolving and removing processes. It is also possible to move the paired piezoelectric elements 70 being held in the mesh vessel 82 onto a substrate by handling with use of a mounting apparatus.

As described above, by removing the first substrate 51 while the piezoelectric element 70 is once held by using the temporary fixing substrate 74 and protected from the chemical solution, bad influences given by the chemical solution to the piezoelectric element 70 can be precisely prevented. Accordingly, the reliability and yield as piezoelectric element 70 may be greatly improved. In addition, the paired piezoelectric elements 70 bonded to the temporary fixing substrate 74 and held facing the bottom of the mesh vessel 82 can be immersed into the solution 84, and by separating the temporary fixing substrate 74, the paired piezoelectric elements 70 can be precisely held on the mesh vessel 82 without causing damage thereto.

Also, since the resin layer 76 is removed while holding the piezoelectric elements 70 together with the temporary fixing substrate 74 in the mesh vessel 82, it is possible to remove the first substrate 51 and to clean a plurality of piezoelectric elements 70 held in the specified positions, and to easily and precisely chuck these elements without breakage when handling the piezoelectric elements 70 in the mounting process. Also, with the temporary fixing substrate 74 separated and the resin layer 76 removed from the piezoelectric element 70, a plurality of piezoelectric elements are held in a state of facing the same side as in the mesh vessel 82, and therefore, they can be easily take out and cleaned as needed, and also can be simply mounted by means of a mounting apparatus.

And, in the manufacturing method of the first preferred embodiment, an actuator element using two piezoelectric elements 70 as a pair has been described. A similar manufacturing method can be employed even in the case of using one piezoelectric element, and needless to say, it is possible to improve the yield and reliability.

Also, in the first preferred embodiment, insulating layer 62 is not formed on the surface of the first lower electrode layer 52 contacted on the first substrate 51 of the paired piezoelectric elements 70, but it is also preferable to apply adhesive to the surface of the first lower electrode layer 52 to let it serve as an insulating layer on the surface of the first lower electrode layer 52 of the piezoelectric element 70 when bonding the paired two piezoelectric elements 70 onto the suspension (not shown). Or, as shown in FIG. 6A, since the piezoelectric element 70 is fixed with respect to its position by the temporary fixing substrate 74 even with the first substrate 51 removed, it is preferable to form an insulating layer (not shown) on the first lower electrode layer 52 as well. Thus, by covering the entire surfaces of the elements with insulating layer, it is possible to prevent lowering of the moisture resistance reliability of the piezoelectric element 70 in particular.

Further, in the first preferred embodiment, in the manufacture of an actuator element using two piezoelectric elements as a pair, the two piezoelectric elements can be arranged with high accuracy, and also, the paired piezoelectric elements are formed of thin layers adjacent to each other, it is easy to make uniform the piezoelectric characteristics of both elements. In addition, since the two structures are partially connected to have an integral configuration, it is easy to prevent the paired piezoelectric elements from being deformed in the step of removing from the temporary fixing substrate and in the step of mounting onto the substrate of the equipment, and also, possible to ensure highly accurate positioning.

According to the manufacturing method in the first preferred embodiment, thin film piezoelectric elements having protective layers with high mass-production feasibility can be obtained with external connecting electrodes arranged on the same surface. Further, since the entire surfaces of the structure including two piezoelectric elements 70 as a pair are covered with an insulating layer, it is possible to obtain thin film piezoelectric elements which may be protected from external moisture and corrosive gases. Also, it is configured that each of the paired piezoelectric elements is nearly equal in thickness to the bonding layer. In this way, the amount of displacement generated when same electric potential is applied to each of the piezoelectric thin films becomes nearly identical with the electric field strength. Also, since the bonding layer is nearly equal in thickness to the piezoelectric thin film, it is possible to execute pattern forming and external connecting electrode forming by via-holes with high accuracy and excellent reliability, enabling the manufacture of piezoelectric elements having great strength.

Also, in the first preferred embodiment, a case of using same material for the first lower electrode layer 52 and the second lower electrode layer 56 has been described, but the present invention is not limited to this. For example, there are no particular limitations provided that the material for electrode layers is able to endure the heating condition in film forming in order to provide the first piezoelectric thin film 53 and the second piezoelectric thin film 57 with specified piezoelectric characteristics or the heat treatment condition after film forming, and is capable of selective etching.

Second Exemplary Embodiment

Figure 8A:
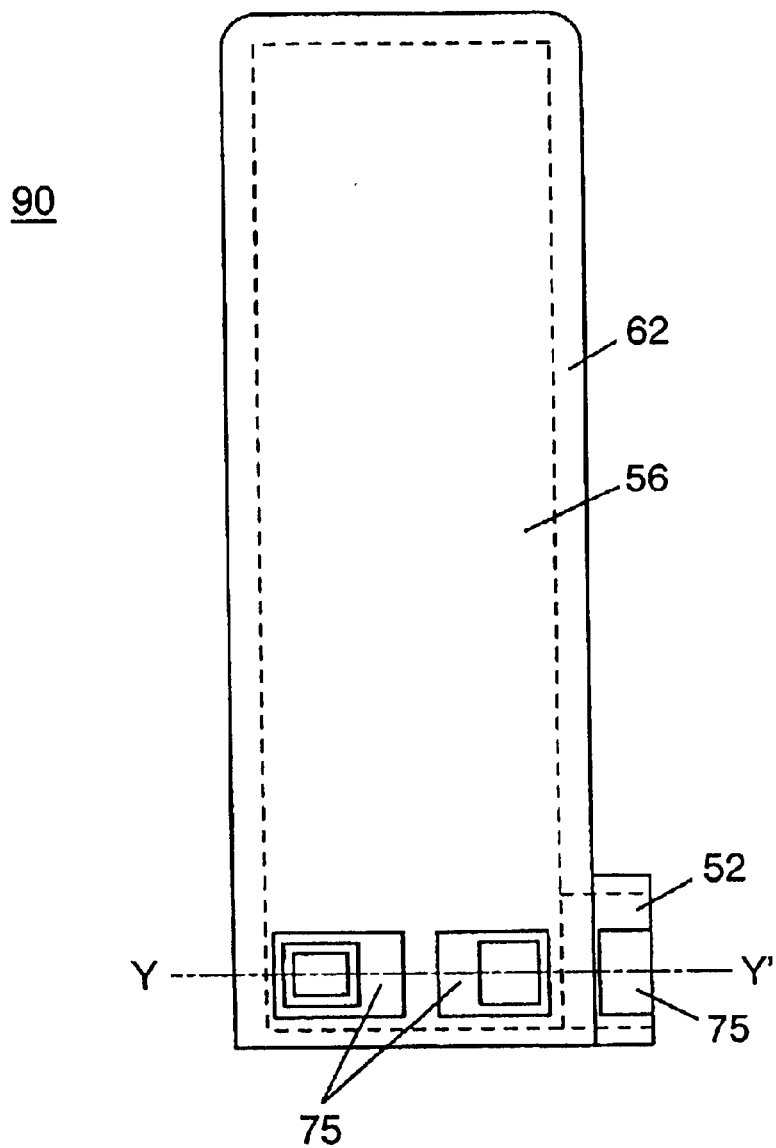
FIG. 8A is a plan view of a piezoelectric element formed by the manufacturing method in the second preferred embodiment of the present invention.
Figure 8B:
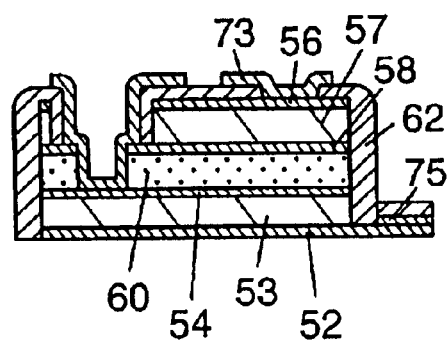
FIG. 8B is a sectional view of the Y-Y' portion in FIG. 8A.

FIG. 8A is a plan view of piezoelectric element 90 made by the manufacturing method in the second preferred embodiment. FIG. 8B shows the Y-Y' portion of same. The piezoelectric element 90 made by the manufacturing method in the present embodiment has a rectangular shape that is very thin in contrast with the plane shape. The elements corresponding to the component elements shown in FIG. 1 and FIG. 2 are provided with same reference numbers. In the second preferred embodiment, connecting electrode layer 73 for electrically leading the first upper electrode layer 54 and the second upper electrode layer 58 out to the surface of piezoelectric element 90 is formed on all of the external connecting electrodes 75. By this configuration, since the same wire bonding condition can be adopted for connection to external equipment, it is possible to perform efficient mounting. The piezoelectric element 90 can be used as an actuator element as in the first preferred embodiment, and also, as a sensor for detecting the voltage in accordance with expansion and contraction.

Figure 9A:
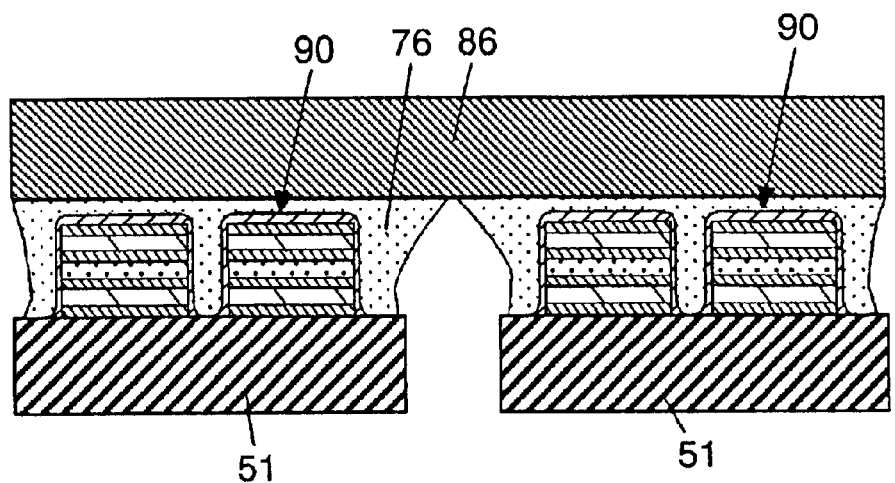
FIG. 9A is an arrangement view showing a plurality of first substrates bonded on a temporary fixing substrate in a main step of the manufacturing method in the second preferred embodiment of the present invention.

Regarding the manufacturing method for the piezoelectric element 90, only the steps that differ from those in the manufacturing method in the first preferred embodiment will be described with reference to FIG. 9A and FIG. 9B. The same as in the manufacturing method in the first preferred embodiment, a plurality of piezoelectric elements 90 are formed on the first substrate 51 in the present preferred embodiment. However, unlike in the first preferred embodiments, they are individually used. The configuration with the piezoelectric element 90 formed on the first substrate shown in FIG. 9A is identical with FIG. 5B in the manufacturing process in the first preferred embodiment. In the manufacturing method in the present preferred embodiment, the points of difference from the manufacturing method in the first preferred embodiment are that the size of temporary fixing substrate 86 is larger than that of the first substrate 51 as shown in FIG. 9A and that a plurality of first substrates 51 with piezoelectric elements 90 formed on the temporary fixing substrate 86 being larger in area than one sheet of the first substrate 51 can be bonded and secured.

In the present preferred embodiment, metal, glass, or ceramic and the like can be used for the temporary fixing substrate 86. Further, it is also possible to form a layer on the surfaces of these substrates, which is made up of metal, oxide, or organic matter that may resist the chemical solution used for etching to remove the first substrate 51. The method of bonding the first substrate 51 onto the temporary fixing substrate 86 is preferable to be identical with the method in the first preferred embodiment. However, it is more desirable to perform the bonding operation at specified pitch intervals because the workability of handling by the mounting apparatus after cleaning and drying may be improved. Since a plurality of first substrates 51 provided with piezoelectric elements 90 are bonded onto the temporary fixing substrate 86, the time required for removing the first substrate 51 can be considerably reduced. For example, the time for the operation can be shortened to nearly one fifth by bonding five sheets of first substrates 51 and by simultaneously etching and removing these substrates.

That is, it is possible to bond a plurality of first substrates 51 with piezoelectric elements formed on a temporary fixing substrate whose area is larger than that of the first substrate, and to remove the first substrates 51 all together, and thereby, the step of removing the first substrates 51 may be simplified. Further, the step of separating a plurality of piezoelectric elements from the temporary fixing substrate can also be simplified.

Figure 9B:
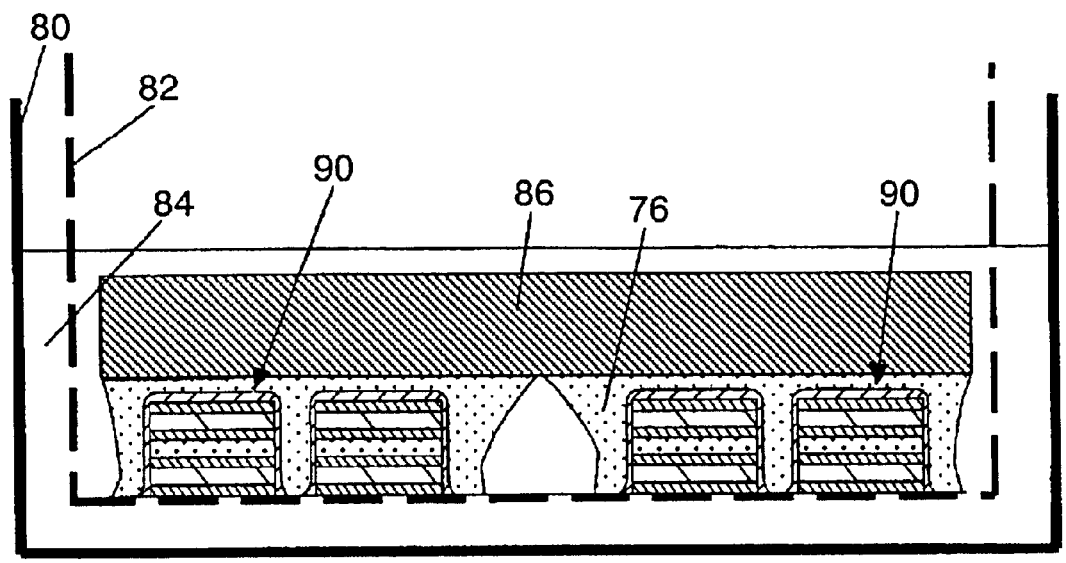
FIG. 9B is an arrangement view showing the structure of FIG. 9A which is stored in a mesh vessel and immersed in solution, with the first substrate removed.

FIG. 9B shows a state of the piezoelectric element immersed in solution 84 for dissolving resin layer 76 after removing the first substrate 51. This process is same as in FIG. 6B shown in the first preferred embodiment. The vessel 80 contains the solution 84, and the piezoelectric elements 90 bonded to the temporary fixing substrate 86 are similarly held in the mesh vessel 82. The mesh of the mesh vessel 82 being made smaller in size than the piezoelectric element 90, the piezoelectric 90 when separated from the temporary fixing substrate 86 will not fall through the mesh onto the bottom of the vessel 80.

In FIG. 9B, the piezoelectric element 90 is held in contact with the mesh vessel 82, but it is also preferable to hold the temporary fixing substrate 86 against either side of the mesh vessel 82, holding the piezoelectric element 90 in such manner that it does not come in contact with the bottom of the mesh vessel 82. Cleaning and drying may be executed in the same way as in the first preferred embodiment. Since many piezoelectric elements 90 are arranged in one mesh vessel 82, the step of mounting them on a specified substrate after cleaning and drying may be further improved in efficiency.

The steps after that are same as in the manufacturing method in the first preferred embodiment, and the description is omitted here.

In the second preferred embodiment, a method of manufacturing a piezoelectric element that is nearly rectangular in shape has been described, but it is needless to say possible to manufacture an actuator element using two piezoelectric elements as a pair in the same way as described in the first preferred embodiment.

Third Exemplary Embodiment

Figure 10A:
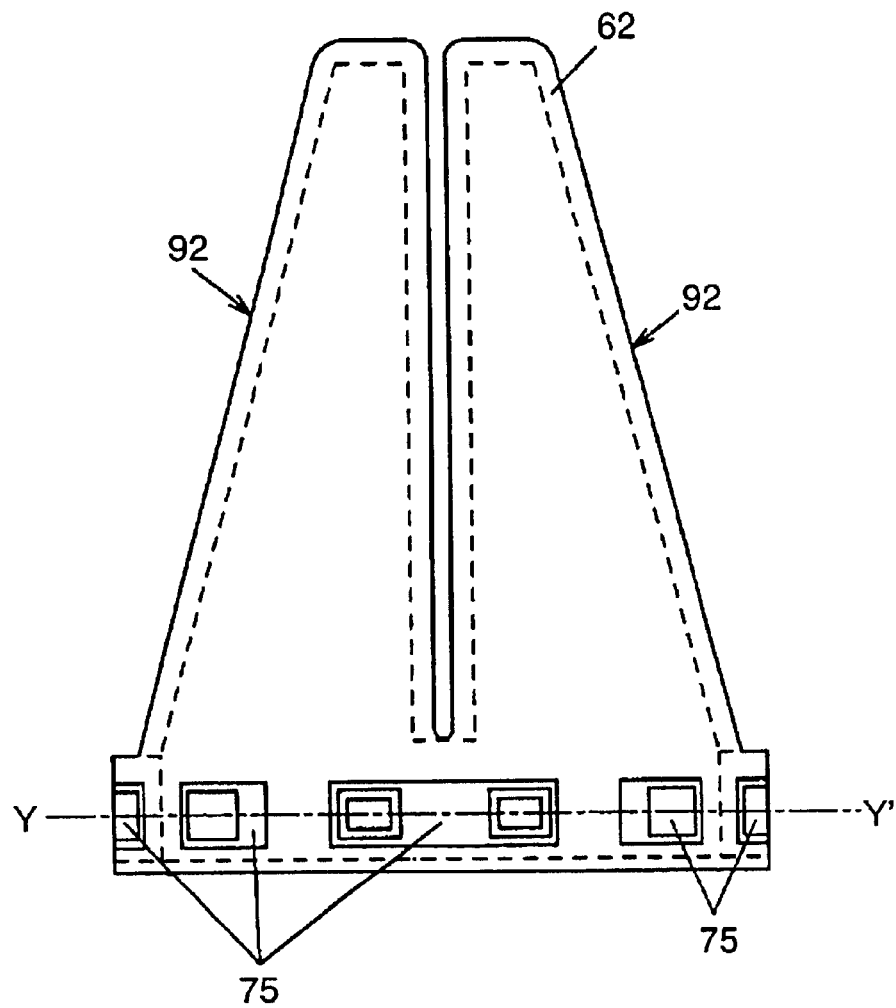
FIG. 10A is a plan view of an actuator with paired two piezoelectric elements made by the manufacturing method in the third preferred embodiment of the present invention.
Figure 10B:
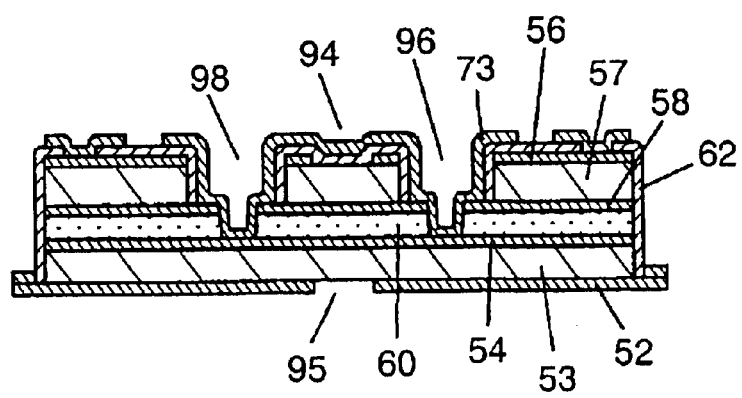
FIG. 10B is a sectional view of the T-Y' portion in Fig.

FIG. 10A is a plan view of an actuator element with two piezoelectric elements as a pair made by the manufacturing method in the third preferred embodiment of the present invention. FIG. 10B is a section al view of the Y-Y' portion of same. The elements which are identical with the component elements shown in FIG. 1 are provided with same reference numbers. Regarding the manufacturing method in the present preferred embodiment, only the steps that differ from those in the manufacturing method in the first preferred embodiment will be described.

In this preferred embodiment, the steps up to the step of removing the second substrate 55 are same as in the first preferred embodiment. After the step of removing the second substrate 55, photolithography and etching treatment are executed on a substrate (as shown in FIG. 4C) with all the layers including the second lower electrode layer 56, the second piezoelectric thin film 57, and the second upper electrode layer 58 accumulated on the first substrate 51. Then, as shown in FIG. 10B, the second lower electrode layer 56 located in the area between two via-holes 96, 98 and at top surface 94 near there is removed by etching. In this case, in order to completely remove the second lower electrode layer 56, it is preferable to perform the etching even on a part of the second piezoelectric thin film 57. As a result, the respective second lower electrode layers 56 of paired two piezoelectric elements 92 are electrically separated from each other. On the other hand, two layers of piezoelectric thin films 53, 57, bonding layer 60, the first and second upper electrode layers 54, 58 are not subjected to etching in the area between two via-holes 96, 98 and on the surface near there, but they are integrated. Accordingly, the strength in handling two piezoelectric elements 92 as a pair may be increased.

After that, the same steps up to the step shown in FIG. 6A in the manufacturing method in the first preferred embodiment are executed. After removing the first substrate 51, and with the element bonded and secured on the temporary fixing substrate 74, photolithography and etching are executed. Thus, as shown in FIG. 10B, the first lower electrode layer 52 in the area between two via-holes 96, 98 and at undersurface 95 near there are removed by etching. Also in this case, in order to completely remove the first lower electrode layer 52, it is allowable to perform the etching on a part of the first piezoelectric thin film 53. In this way, the respective first lower electrode layers 52 of paired piezoelectric elements 92 are electrically separated from each other. In this step, since many piezoelectric elements 92 are bonded and secured on the temporary fixing substrate 74, the layers can be removed by etching all together, enabling efficient operation. As a method of removing only specified portions of the first lower electrode layer 52 and the second lower electrode layer 56, it is preferable to employ another method, for example, such that specified portions are abraded and removed by application of a laser beam, besides lithography and etching.

The steps after that are same as those described in the first preferred embodiment, and the description is omitted here.

By this manufacturing method, the first lower electrode layer 52 and the second lower electrode layer 56 are electrically separated from each other between the respective piezoelectric elements 92, but in the area between two via-holes 96, 98 and at top surface 94 near there, two layers of piezoelectric thin films 53, 57, two layers of electrode layers 54, 58 and bonding layer 60 are integrated. Accordingly, the strength of the actuator having a pair of piezoelectric elements may be greatly increased as a whole. In addition, providing the external connecting electrode 75 at the central portion by connecting the connecting electrodes 73 to each other which are led out of the via-holes 96, 98, it is possible to reduce the man hour required for the connecting work such as wire bonding.

The piezoelectric elements made by the above manufacturing method may be driven with a low voltage, and the amount of displacement can be nearly doubled as compared with the case of only one element by properly controlling the voltage applied to the two piezoelectric elements. Further, since the structures are integrally connected to each other in a specified area near the external connecting electrode, the handling of the paired piezoelectric elements and their mounting onto a substrate will be greatly simplified, and at the same time, they can be accurately mounted on the substrate.

Fourth Exemplary Embodiment

Figure 11A:
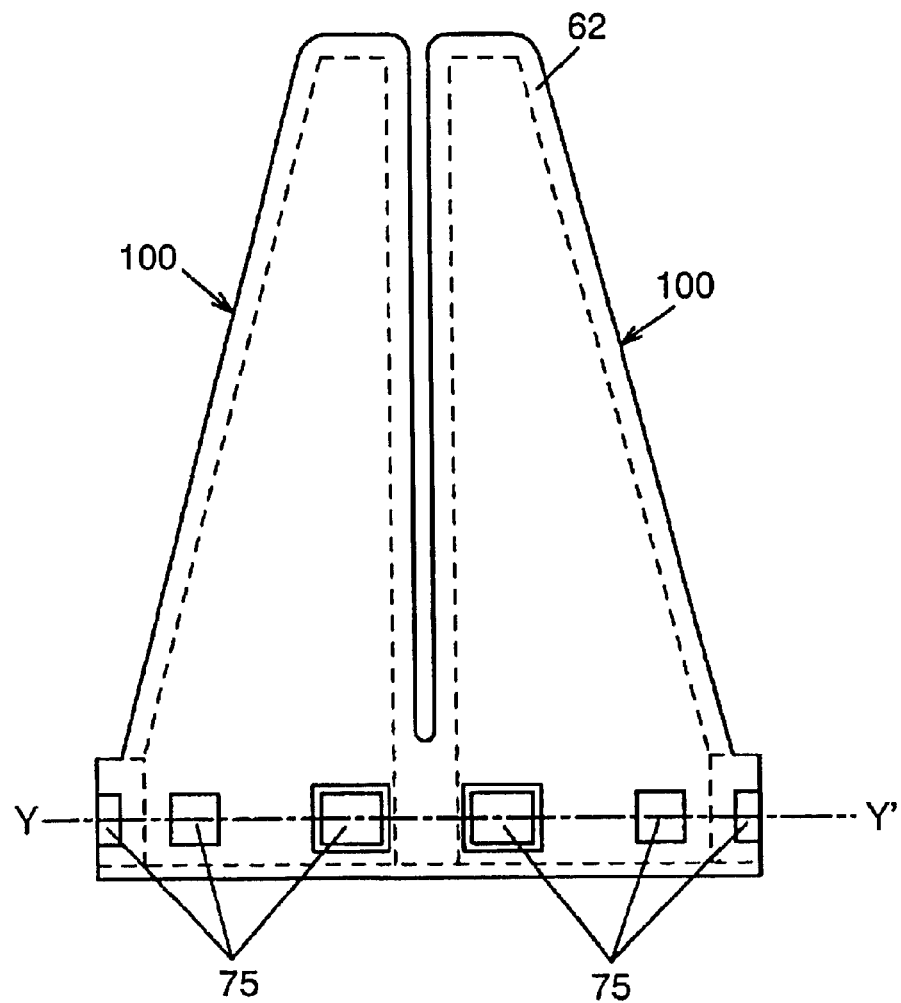
FIG. 11A is a plan view of an actuator with paired two piezoelectric elements made by the manufacturing method in the fourth preferred embodiment of the present invention.
Figure 11B:
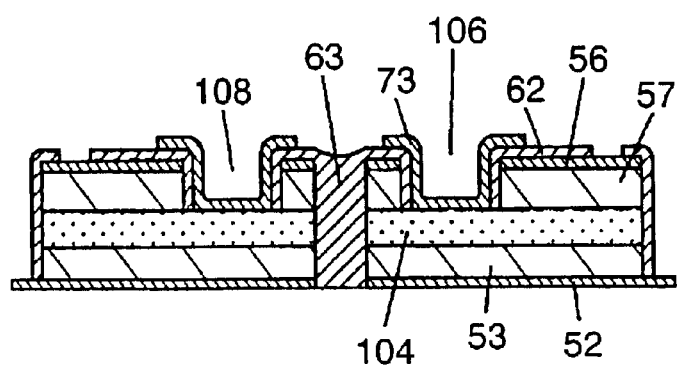
FIG. 11B is a sectional view of the Y-Y' portion in FIG. 10A.

FIG. 11A is a plan view of an actuator element having two piezoelectric elements made by the manufacturing method in the fourth preferred embodiment of the present invention. FIG. 11B is a sectional view of the Y-Y' portion of FIG. 11A. The elements which are identical with the component elements shown in FIG. 1 are provided with the same reference numbers. As for the manufacturing method in the present preferred embodiment, only the steps that differ from those in the manufacturing method in the first preferred embodiment will be described.

In the manufacturing method in the present preferred embodiment, the first lower electrode layer 52 and the first piezoelectric thin film 53 are formed on the first substrate 51, while the second lower electrode layer 56 and the second piezoelectric thin film 57 are formed on the second substrate 55. The first piezoelectric thin film 53 and the second piezoelectric thin film 57 are bonded face to face by conductive adhesive layer 104. Further, when external connecting electrode 75 of piezoelectric element 100 is formed, via-holes 106, 108 may be formed by etching the second lower electrode layer 56 and the second piezoelectric thin film 57 into specified shapes, followed by forming insulating layer 62 and etching the insulating layer 62 into a specified shape. Unlike the manufacturing method in the first preferred embodiment, the first upper electrode layer and the second upper electrode layer are not needed. As for the other steps, the description will be omitted because they are same as in the manufacturing method in the first preferred embodiment.

As described above, with a pair of piezoelectric elements 100 formed, it is not necessary to form an upper layer electrode on each of the first piezoelectric thin film 53 and the second piezoelectric thin film 57, and also, via-hole pattern forming for external connecting electrode forming is simplified, making it possible to simplify the process.

That is, the function of the upper layer electrode of the paired electrode layers with a piezoelectric element held therebetween can be obtained by using an adhesive made up of conductive material. Therefore, the step of forming an upper electrode layer on a piezoelectric element and the step of bonding can be performed simultaneously, and it is possible to simplify the manufacturing process. Also, the step of forming an upper electrode layer can be omitted since the conductive adhesive layer serves a function as an upper electrode layer. In case the adhesive layer is thicker, selective etching for forming via-holes may be more precisely performed, but if it is too thick, it will cause hindrance to the displacement of piezoelectric thin film. On the other hand, in case the adhesive layer is thinner, it is advantageous with respect to the displacement of piezoelectric thin film, but if the layer is too thin, it will cause the structure to be lowered in strength. As a layer thickness that may meet the requirement, it is desirable to be nearly equal to the thickness of the second piezoelectric thin film.

Due to the fourth preferred embodiment, it is not necessary to form the first upper electrode layer and the second upper electrode layer, thereby simplifying the layer forming step, and the piezoelectric element obtained enables the simplification of the via-hole forming process for forming external connecting electrodes.

Incidentally, as for the manufacturing method in the fourth preferred embodiment, the manufacture according to the manufacturing method in the first preferred embodiment except some steps has been described. It is also preferable to manufacture similarly in accordance with the second preferred embodiment and the third preferred embodiment except some steps.

Also, in the manufacturing method of the present invention, it is also possible to use a substrate that is a combination of two substrates selected from the group consisting of a MgO substrate, Si substrate, strontium titanate mono-crystalline substrate, and sapphire substrate with respect to the first substrate and the second substrate. For example, when a magnesium oxide mono-crystalline substrate is used as the first substrate, and a silicon mono-crystalline substrate as the second substrate, a layer vertically oriented to the layer surface with good piezoelectric characteristics can be obtained in the layer forming step with respect to the magnesium oxide mono-crystalline substrate, while in the case of silicon mono-crystalline substrate, by heat-treating after forming piezoelectric thin film, it is possible to obtain piezoelectric thin film vertically oriented to the layer surface, which is equivalent in piezoelectric characteristics to the piezoelectric thin film on the MgO substrate. Even when a mixed solution of hydrofluoric acid and nitric acid is used for removing the Si substrate used as the second substrate, the MgO substrate used as the first substrate will not be corroded by this solution. Accordingly, it is not necessary to protect the MgO substrate with resin or the like in particular.

REFERENCE NUMERALS

51 First substrate
52 First lower electrode layer
53 First piezoelectric thin film
54 First upper electrode layer
55 Second substrate
56 Second lower electrode layer
57 Second piezoelectric thin film
58 Second upper electrode layer
60, 104 Adhesive layer
62 Insulating layer
63 Area
66 Structure
70, 90, 92, 100 Piezoelectric element
73 Connecting electrode layer
74, 86 Temporary fixing substrate
75 External connecting electrode
76 Resin layer
80 Vessel
82 Mesh vessel
84 Solution
94 Top surface
95 Undersurface
96, 98, 106, 108 Via-hole
210 Disk
220 Spindle motor
230 Actuator unit
231 Slider
232 Actuator element
233 Suspension
234 Plate spring portion
235 Flexible wiring board
236 Supporting arm
240 Bearing
250 Voice coil

What is claimed is:

1. A method for manufacturing thin film piezoelectric elements, comprising:

sequentially laminating a first lower electrode layer, a first piezoelectric thin film, and a first upper electrode layer on a first substrate;

sequentially laminating a second lover electrode layer, a second piezoelectric thin film, and a second upper electrode layer on a second substrate;

bonding said first upper electrode layer and said second upper electrode layer in opposed relation to each other with an adhesive layer therebetween;

selectively removing only said second substrate;

processing said first lower electrode layer, said first piezoelectric thin film, said first upper electrode layer, said second lower electrode layer, said second piezoelectric thin film, said second upper electrode layer, and said adhesive layer into specified shapes respectively or all together, thereby forming a plurality of separated structures;

covering each of said plurality of structures with an insulating layer, forming external connecting electrodes for connecting said first upper electrode layer, said first lower electrode layer, said second upper electrode layer, and said second lower electrode layer to external equipment, thereby making a plurality of piezoelectric elements;

covering said plurality of piezoelectric elements with a resin layer, and further bonding a temporary fixing substrate thereto;

selectively removing only said first substrate; and lowering the adhesion of the adhesive layer used for bonding said temporary fixing substrate, or dissolving said adhesive layer to separate said temporary fixing substrate, and also removing said resin layer from said piezoelectric element surface to individually separate said plurality of piezoelectric elements.

2. The method for manufacturing thin film piezoelectric elements of claim 1, wherein forming said plurality of structures further comprises making a piezoelectric thin film connection at least in a part of a specified area of paired two structures.

3. The method for manufacturing thin film piezoelectric elements of claim 1, wherein separating said temporary fixing substrate held in a mesh vessel having an opening at least smaller in size than a plurality of piezoelectric elements bonded on said temporary fixing substrate, comprises dissolving or lowering the adhesion of the adhesive layer to separate said temporary fixing substrate, and separating said plurality of piezoelectric elements by removing the resin from said piezoelectric element surfaces.

4. The method for manufacturing thin film piezoelectric elements of claim 1, wherein said external connecting electrode is formed on a same surface of said piezoelectric element.

5. The method for manufacturing thin film piezoelectric elements of claim 1, wherein the adhesive used for bonding said temporary fixing substrate and the resin layer used to cover said piezoelectric element are the same material, and said temporary fixing substrate is bonded by said resin layer.

6. The method for manufacturing thin film piezoelectric elements of claim 1, wherein a layer that is corrosion-resistant against a solution, a gas containing active species, or at least a partially ionized gas used for removing the first substrate, is formed over the entire surface of said temporary fixing substrate to be used as said temporary fixing substrate.

7. The method for manufacturing thin film piezoelectric elements of claim 6, wherein said temporary fixing substrate is large enough to bond a plurality of first substrates thereon.

8. The method for manufacturing thin film piezoelectric elements of claim 1, wherein said temporary fixing substrate is large enough to bond a plurality of first substrates thereon.

9. The method for manufacturing thin film piezoelectric elements of claim 1, wherein said first substrate and said second substrate have the same material and shape.

10. The method for manufacturing thin film piezoelectric elements of claim 1, wherein said first substrate and said second substrate comprise a combination of two types of substrate selected from the group consisting of a magnesium oxide mono-crystalline substrate, silicon mono-crystalline substrate, strontium titanate mono-crystalline substrate and sapphire substrate.

11. The method for manufacturing thin film piezoelectric elements of claim 1, wherein said first upper electrode layer and said second upper electrode layer have the same material and layer deposition system.

12. The method for manufacturing thin film piezoelectric elements of claim 1, wherein said first piezoelectric thin film and said second piezoelectric thin film have the same material and film deposition system.

13. The method for manufacturing thin film piezoelectric elements of claim 12, wherein said first piezoelectric thin film and said second piezoelectric thin film are formed nearly equal in thickness.

14. The method for manufacturing thin film piezoelectric elements of claim 1, wherein the adhesive layer that bonds and secures said first upper electrode layer and said second upper electrode layer in opposed relation to each other is formed nearly equal in thickness at least to said second piezoelectric thin film.

* * * * *

UNITED STATES PATENT AND TRADEMARK OFFICE
CERTIFICATE OF CORRECTION

PATENT NO. : 6,912,760 B2
DATED : July 5, 2005
INVENTOR(S) : Hirokazu Uchiyama et al.

It is certified that error appears in the above-identified patent and that said Letters Patent is hereby corrected as shown below:

Title page,
Item [56], References Cited, OTHER PUBLICATIONS,
"Mills et al." reference, "Composities" should be -- Composites --.

Column 16,
Line 59, "lover" should be -- lower --.

Signed and Sealed this

Fourteenth Day of February, 2006

JON W. DUDAS
*Director of the United States Patent and Trademark Office*